(12) United States Patent
Vera Rojas et al.

(10) Patent No.: US 8,332,722 B1
(45) Date of Patent: Dec. 11, 2012

(54) METHOD AND ARCHITECTURE FOR PERFORMING SCRUBBING OF AN FPGA'S CONFIGURATION MEMORY

(75) Inventors: Guillermo Alonzo Vera Rojas, Albuquerque, NM (US); Sasan Ardalan, Albuquerque, MN (US)

(73) Assignee: Microelectronics Research and Development Corporation, Colorado City, CO (US)

( * ) Notice: Subject to any disclaimer, the term of this patent is extended or adjusted under 35 U.S.C. 154(b) by 192 days.

(21) Appl. No.: 12/874,219

(22) Filed: Sep. 1, 2010

Related U.S. Application Data

(63) Continuation of application No. 12/854,887, filed on Aug. 11, 2010, now abandoned.

(51) Int. Cl.
*H03M 13/00* (2006.01)
(52) U.S. Cl. ........................ 714/758; 714/752
(58) Field of Classification Search ............... 714/752, 714/758
See application file for complete search history.

(56) References Cited

U.S. PATENT DOCUMENTS

| | | | |
|---|---|---|---|
| 7,576,557 B1 * | 8/2009 | Tseng et al. ............ | 326/9 |
| 2008/0222469 A1 * | 9/2008 | Rickert et al. ............ | 714/726 |

* cited by examiner

*Primary Examiner* — Sam Rizk
(74) *Attorney, Agent, or Firm* — Todd L. Juneau

(57) ABSTRACT

This invention relates to device and methods for scrubbing configurable logic devices that are used in high-radiation environments.

24 Claims, 12 Drawing Sheets

FIG. 1B

| BIT -> | 13 | 12 | 11 | 10 | 9 | 8 | 7 | 6 | 5 | 4 | 3 | 2 | 1 | 0 | Function |
|---|---|---|---|---|---|---|---|---|---|---|---|---|---|---|---|
| Field 1st form -> | | CODE | | | | | | | | DATA | | | | | |
| Field 2nd form -> | | CODE | | | TARGET ADDRESS | | | | | DATA | | | | | |
| Field 3rd form -> | CODE | | | TARGET ADDRESS | | | | | | SOURCE ADDRESS | | | | | |
| MNEMONIC | | | | | | | | | | | | | | | |
| NOOP | 0 | 0 | 0 | 0 | 0 | 0 | x | x | x | x | x | x | x | x | No operation |
| AJMB | 0 | 0 | 0 | 0 | 0 | 1 | x | x | x | x | x | x | x | x | Absolute Jump if STATUS_REG's bit specified by DATA field is true |
| AJMP | 0 | 0 | 0 | 0 | 1 | 0 | x | x | x | x | x | x | x | x | Absolute Jump always. DATA fiel represents LSB of absolute address |
| RJMB | 0 | 0 | 0 | 0 | 1 | 1 | x | x | x | x | x | x | x | x | Relative Jump if STATUS_REG's bit specified by DATA field is true |
| RJMP | 0 | 0 | 0 | 1 | 0 | 0 | x | x | x | x | x | x | x | x | Relative Jump always. DATA fiel represents LSB of absolute address |
| CALL | 0 | 0 | 0 | 1 | 0 | 1 | x | x | x | x | x | x | x | x | Call sub-routine |
| RETN | 0 | 0 | 0 | 1 | 1 | 0 | x | x | x | x | x | x | x | x | Return from subroutine |
| UNUSED | 0 | 0 | 0 | 1 | 1 | 1 | x | x | x | x | x | x | x | x | Free instruction space |
| MOVE | 0 | 0 | 1 | x | x | x | x | x | x | x | x | x | x | x | Move data from source to target |
| UNUSED | 0 | 1 | 0 | x | x | x | x | x | x | x | x | x | x | x | Free instruction space |
| UNUSED | 0 | 1 | 1 | x | x | x | x | x | x | x | x | x | x | x | Free instruction space |
| LOAD | 1 | x | x | x | x | x | x | x | x | x | x | x | x | x | Load data to target |

METHOD AND ARCHITECTURE FOR PERFORMING SCRUBBING OF AN FPGA'S CONFIGURATION MEMORY

CROSS REFERENCE TO RELATED APPLICATIONS

This application is a continuation and claims priority benefit under 35 USC 120 to U.S. application Ser. No. 12/854,887, filed 11 Aug. 2010 now abandoned, the contents of which are incorporated herein in their entirety.

STATEMENT REGARDING FEDERALLY SPONSORED RESEARCH OR DEVELOPMENT

This invention was made with Government support under contract FA9453-08-M-0096 awarded by the U.S. Air Force/Research Lab. The Government has certain rights in the invention.

NAMES OF PARTIES TO A JOINT RESEARCH AGREEMENT

Not applicable.

SEQUENCE LISTING INCLUDED AND INCORPORATED BY REFERENCE HEREIN

Not applicable.

BACKGROUND

1. Field of the Invention

This invention relates to processes and microcontrollers for scrubbing, or removing errors from, a computer memory's content by re-writing it periodically with correct values.

2. Background of the Invention

A Field Programmable Gate Array (FPGA) is an integrated circuit which is configurable after it has been manufactured. Some integrated circuits are designed to be application specific (ASIC) and act as finite state machines which do not have the configurability of an FPGA. However, radiation sources are known to damage configurable integrated circuits.

Radiation in the form of gamma rays (photons, x-rays), electrons, protons, and heavy ions can damage the silicon of an integrated circuit. When radiation hits an integrated circuit, a bit flip can occur, thus destroying it's binary functionality, i.e. by changing a 0 to a 1 or a 1 to a 0. Changing a bit, changes the encoding of the 8-bit byte, changes the meaning of the logic, and renders the chip useless for it's intended function. Further, the lost electron can create a voltage where electrons gets pulled away into another component and destroy it. High energy ions can penetrate any thickness of material that is practical to put in space. If they penetrate a microcircuit, they leave a trail of holes and electrons in their wake. These charge carriers can be collected by one or more junctions and result in current transients that can produce several different, undesirable phenomena labeled Single Event Effects (SEE). These include:

1. SEU (single event upset)—a state change in a memory element (latch, flip flop, memory cell) that causes the information stored in the bit to be lost;
2. SET (single event transient)—a propagating transient with sufficient amplitude and duration to be mistaken as data, which may or may not result in information loss depending on its temporal relationship to the clock;
3. SEL (single event latchup)—a potentially damaging, high current state resulting from a four layer (PNPN) path being triggered into conduction by the current transient from the ionization strike;
4. SESB (single event snapback)—a potentially damaging high current state resulting from a 3 layer (NPN or PNP) being triggered into conduction by the current transient from the ionization strike;
5. SEDR (single event dielectric rupture)—catastrophic damage to the gate oxide due to a strike by an ionized particle.

Since all these phenomena are the result of a single ion strike, they are referred to as single event effects (SEE).

SEU's occur a number of times per day to semiconductor chips in space, but they can also occur near terrestrial radiation sources. Scrubbing is a term that denotes the process of removing errors from a memory's content by re-writing it periodically with correct values fetched from a master or "gold" copy.

The main weakness of a scrubbing solution is its own susceptibility to SEUs. An upset on the scrubber circuitry may result in writing wrong data in the configuration memory of the device. This is particularly dangerous as it may result in the destruction of the device.

FPGA's are susceptible to bit flips, but since they a reconfigurable, their configuration can be corrected by conforming their configuration to a master copy. Typical FPGAs comprise three types of configurable elements: configurable logic blocks (CLBs), input/output blocks, and interconnects. FPGAs that rely on static latches for their programming elements, also known as SRAM FPGAs, are reconfigurable, meaning they can be reprogrammed with the same or different configuration data; application specific integrated circuits (ASICs) cannot be reconfigured.

An FPGA's configuration memory is a special case since the data in the configuration memory dictates the logic the FPGA implements. Scrubbing of an FPGA is possible in Xilinx devices due to their glitchless configuration memory cell. This feature basically allows a write process to happen in a configuration memory cell without generating glitches in the underlying logic as long as no change in state is produced. Thus, periodic scrubbing (re-write of the configuration memory) will not affect the circuit the FPGA implements, and will only correct upset bits.

The glitchless characteristic of the memory cell have two exceptions: when Look Up Tables (LUTs) are configured in Shift Register Mode or as a RAM. If a frame that contains configuration bits for a LUT configured in any of these two ways is modified or just read back, then the LUT or shift register will be interrupted and it will lose its state. This has to be taken into consideration by the designer implementing a scrubbing solution. A workaround is to place the LUTs configured in this way into columns (frames) that will not be subject to scrubbing.

The configuration memory can be accessed within the FPGA fabric using the Internal Configuration Access Port (ICAP). This is useful for scrubbers implemented within the FPGA logic, thus labeled "self-scrubber". The ICAP port can be instantiated with either an 8-bit bus or a 32-bit bus. Assuming a maximum operation frequency of a 100 MHz for this port, a scrubber could access the configuration memory at a maximum speed of 3.2 Gb/sec.

The configuration memory can also be accessed externally through the SelectMAP interface or the JTAG interface. The SelectMAP interface can be declared with either an 8-bit bus or a 32-bit bus. The JTAG interface is serial. Scrubbers using this interfaces are generally labeled as "external scrubber".

The scrubbing process has also variants. The first solutions reported a method that is now known as "blind scrubbing". In this case the configuration memory is re-written in a periodic fashion independently of whatever it has an upset bit or not. This approach is simple since it doesn't require the scrubber to perform a readback of the configuration memory content and a error detection procedure. The disadvantage of this approach is that it has significant overhead in terms of power consumption and performance, and is more susceptible to Single Event Functional Errors (SEFIs).

Later solutions implemented a readback-detect-error method. In this more selective approach the scrubber must read back the configuration memory and detect errors through some kind of error detection code. Scrubbing happens only when an upset is found in the configuration. This approach saves power compared to blind scrubbing and allows for scrubbing strategies where critical regions are differentiated from less important sections. In order to detect errors in the contents of any memory, some kind of parity bits or error correction and detection codes have to be embedded within the memory contents. In this approach, a code book is calculated using a parity or hash function (e.g. CRC) by reading back the memory contents (e.g. a FPGA's configuration memory). This code book is locally stored and it is used in subsequent iterations to compare against the codes generated by the memory contents read afterwards. A discrepancy will signal an upset occurrence.

Another variant on the scrubbing process is its granularity. First scrubbers performed scrubbing on the full device. However, these solutions add unnecessary power consumption, triple logic resources, and dictate area (on the chip) restrictions.

Later scrubbers allow selective scrubbing or frame-base scrubbing. Frame based scrubbing allows the user to implement different scrubbing strategies based on priority of the different parts of a system in an FPGA. Frame-based scrubbers have also the advantage that less data is written in the configuration memory overall. This reduces the possibility of a malfunctioning scrubber or a corrupted gold copy of the bitstream introducing errors in the configuration instead of correct them.

Accordingly, some of the problems in the prior art may be summarized as follows. Several scrubbing solutions have been reported in the literature, including Xilinx's application notes with recommended approaches. All these alternatives are either a microprocessor based scrubber (for instance Xilinx's reference designs based on PicoBlaze) or finite state machines with the sole functionality to read and/or write from the configuration memory. Processor-based scrubbers tend to increase the overall system's cross-section when implemented in a self-scrubbing configuration. State machine-based scrubbers, on the other hand, tend to have a rigid deployment, severely limiting their flexibility to support extra features such as reporting, statistics gathering or adaptation to new configurations.

BRIEF SUMMARY OF THE INVENTION

A scrubber solution is provided herein based on a small microcontroller which provides flexibility with reduced logical resources usage to detect and correct configuration errors within configurable logic devices, such as FPGAs.

This scrubber solution can be implemented in an FPGA or in an ASIC. Thus resource consumption will be expressed differently and the same can be said of the frequency of operation. In one non-limiting example, the scrubber can be a RISC, 8-bit, 9-instruction microcontroller specifically designed for scrubbing memories. Although as said, it is not necessarily so limited and can also be implemented in an FPGA or in an ASIC. It has the capacity to calculate a CRC codebook of up to 1024 words on the fly and to use it to detect errors. This scrubber can be configured to perform blind scrubbing or readback-detect-correct type of operations. It also supports frame-based scrubbing, which allows a user to develop custom scrubbing techniques that better adapts to a specific system's requirements.

The architecture is based on an small, application specific microcontroller designed specifically to move data in and out of the FPGA's configuration memory. Although processor-based, this solution is smaller than currently picoblaze-based solutions due to its restrictive set of instructions. The scrubber can be implemented as a self-scrubber (in an FPGA) or as an external scrubber (in an FPGA or an ASIC).

In a preferred embodiment, there is provided, a scrubber for detecting and correcting errors in a configurable logic device, comprising an application specific integrated circuit having (i) an embedded radiation-hardened-by-design microcontroller, (ii) radiation-hardened-by-design message digest (e.g. CRC) computation logic, (iii) radiation-hardened-by-design register storage, (iv) a configuration interface that communicates with the microcontroller through a data bus, a control bus, and a status bus, and (v) a error detection and correction, e.g. BCH, encoding/decoding circuit.

Additional preferred embodiments, include wherein the radiation-hardened-by-design integrated circuit comprises one or more temporal latches use for register storage, or wherein the radiation-hardened-by-design comprises DICE registers for storage.

Another preferred embodiment, provides a complete system, comprising (i) a configurable logic device, (ii) the scrubber described herein connected to the configurable logic device, and (iii) a Non-Volatile-Memory connected to the scrubber.

Additional preferred embodiments provide wherein the configurable logic device is an FPGA, wherein the Non-Volatile Memory is PROM, wherein the scrubber is external to the FPGA, and wherein the scrubber is integrated within the FPGA.

In another preferred embodiment, there is provided wherein the Non-Volatile Memory has program instructions directing the microcontroller of the scrubber to implement a process that calculates and stores message digest data for each frame on the FPGA and adds a header to the message digest data of each frame to create a verified message digest data, wherein the header includes a verification key.

Preferably but not limited by, this message digest data is a CRC or checksum.

Further, the verified message digest data is also preferably stored in one or more temporal latches.

In another preferred embodiment of the invention, there is provided a method detecting a configuration error in a configurable logic device comprising the steps of (1) comparing on a frame-by-frame basis the message digest data of each frame written to the configurable logic device against a stored pre-computed message digest data for each frame wherein the pre-computed message digest data is stored in a temporal latches of a scrubber integrated circuit, and (2) reporting a configuration error within a frame where the message digest data of a frame written to the configurable logic device is not identical to the stored pre-computed message digest data in the temporal latch of the scrubber integrated circuit.

In a preferred non-limiting embodiment of the method the configurable logic device is an FPGA.

In a preferred non-limiting embodiment of the method the message digest data is a CRC or checksum.

In a preferred non-limiting embodiment of the method further comprises the step of correcting the error using BCH error correcting codes.

In other preferred embodiments, there is provided: a method wherein the scrubber integrated circuit comprises a microcontroller, a non-volatile read only memory, and a configuration memory interface, and further comprising the preliminary step of loading instructions into the microcontroller from the non-volatile memory to implement the process steps of (1) comparing and (2) reporting; a method further comprising a pre-processing step of adding frame ID tags to the bitstream to create a modified bitstream, wherein the microprocessor parses the modified bitstream to identify frames to compute CRC and check bits; a method further comprising wherein error correcting codes are used to correct bit errors; a method wherein the error correcting codes are BCH codes; a method wherein the pre-processing step adds pad bits to the frame to form k bit message for BCh encoding; a method wherein the check bits are computed on the fly as the configuration is loaded on a frame by frame basis into FPGA and wherein the check bits are stored in temporal latches registers; a method of computing a message digest on a frame by frame basis in a system of claim 10 and storing the message digests in temporal latches/registers with tags to identify frame message digest and check bits; In a system as claimed herein, a method comprising the steps of reading back frames from an FPGA, adding pad bits and check bits to form n bit code, decoding the n bit code using a BCH decoder, and correcting the bit errors; a method further comprising the step of writing back into the FPGA the error corrected frame; a method further comprising the steps of computing the message digest of the error corrected frame, comparing the message digest with the stored message digest for the frame that is stored in the scrubber, and if there is a match, doing nothing, and if there is a mismatch reloading the frame from the non-volatile memory and writing to the FPGA; and/or a method further comprising the step of logging multiple bit errors for later retrieval and analysis.

BRIEF DESCRIPTION OF THE DRAWINGS

FIG. 1B is a table and shows an example of a microcontroller supporting 9 instructions focused on the tasks of moving data and flow control.

DETAILED DESCRIPTION OF THE INVENTION

Architecture

The scrubber presented herein has the flexibility to implement any of the scrubbing variants described in the previous section. At the core of the scrubber is an 8-bit microcontroller.

Figure 1A:
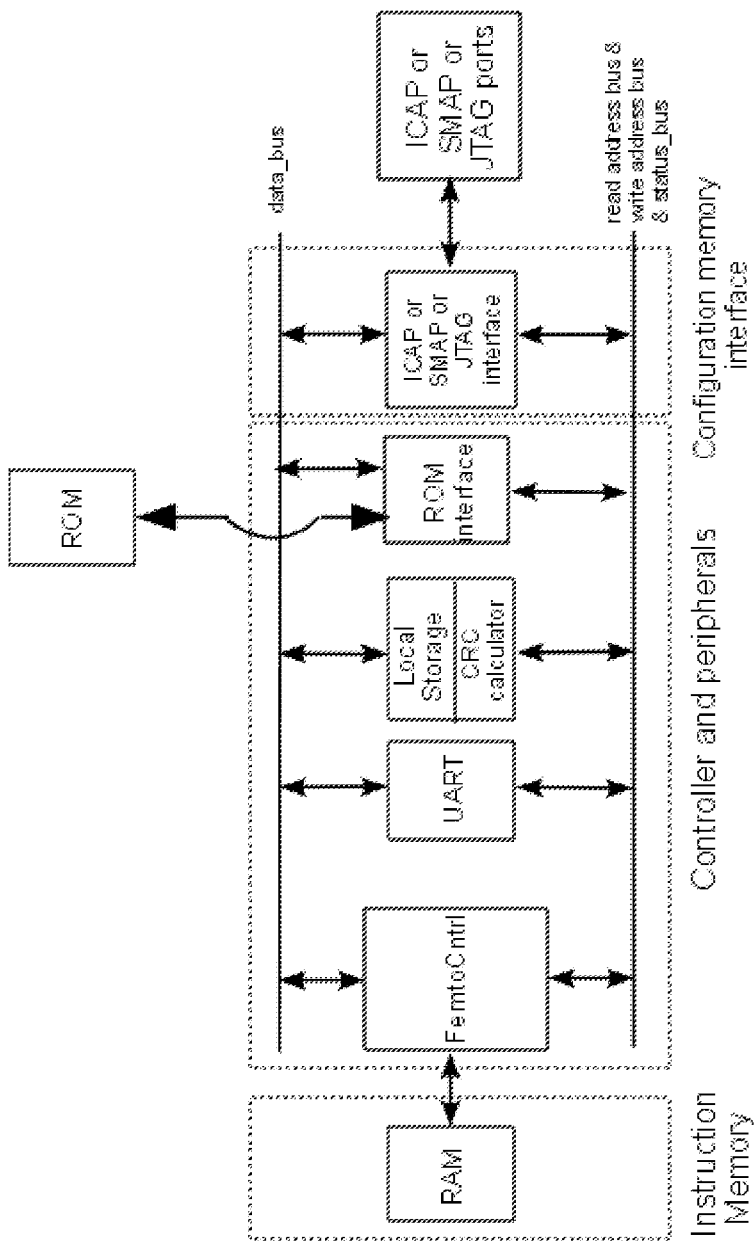
FIG. 1A is a block diagram of an example of the scrubber.

In one example, this microcontroller supports only 9 instructions focused on the tasks of moving data and flow control (see FIG. 1B). Every instruction is executed in a single CPU cycle. The microcontroller's interface with its peripherals consists of a status bus, a data bus and two address buses, one for reading and the other for writing data. The dual address bus allows the microcontroller to move data between peripherals in a simple and seamless manner. The microcontroller has an instruction memory (up to $2^{16}-1$), no separated data memory and 4 internal 8-bit registers. The instruction memory can be written by the microcontroller.

Figure 2:
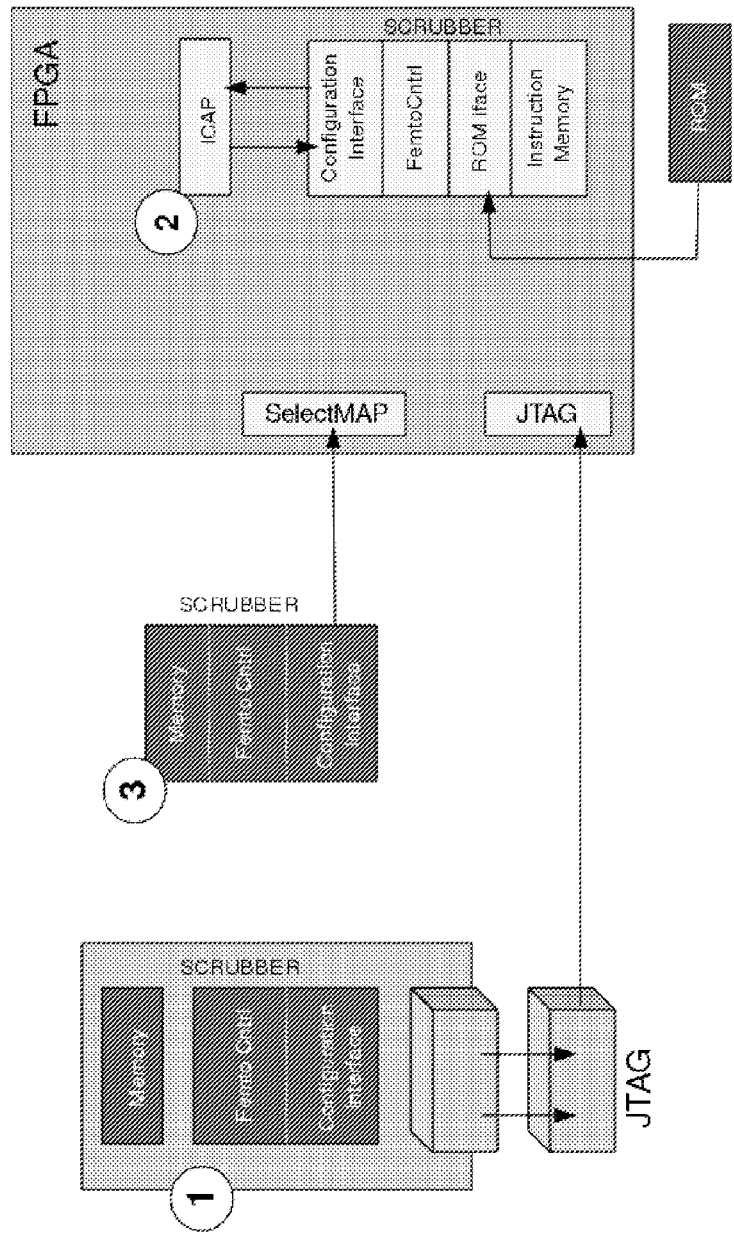
FIG. 2 is a graphic that shows some of the possible hardware setups.

Referring now to FIG. 1, a block diagram is shown. The broken lines in the diagram divide the scrubber into 3 main blocks that can be implemented together or separately. The block to the right—configuration interface—can be customized to access different memory access ports (i.e. JTAG, SelectMAP, ICAP). The interface between this block and the controller (the block in the middle) is independent of the type of memory supported by the configuration interface. The block to the left consists of memory for the controller. This memory can be implemented in many ways according to any particular hardware setup. Its function is to serve as an instruction memory and data memory in case the application requires it. Some of the possible hardware setups are shown in FIG. 2.

Figure 3:
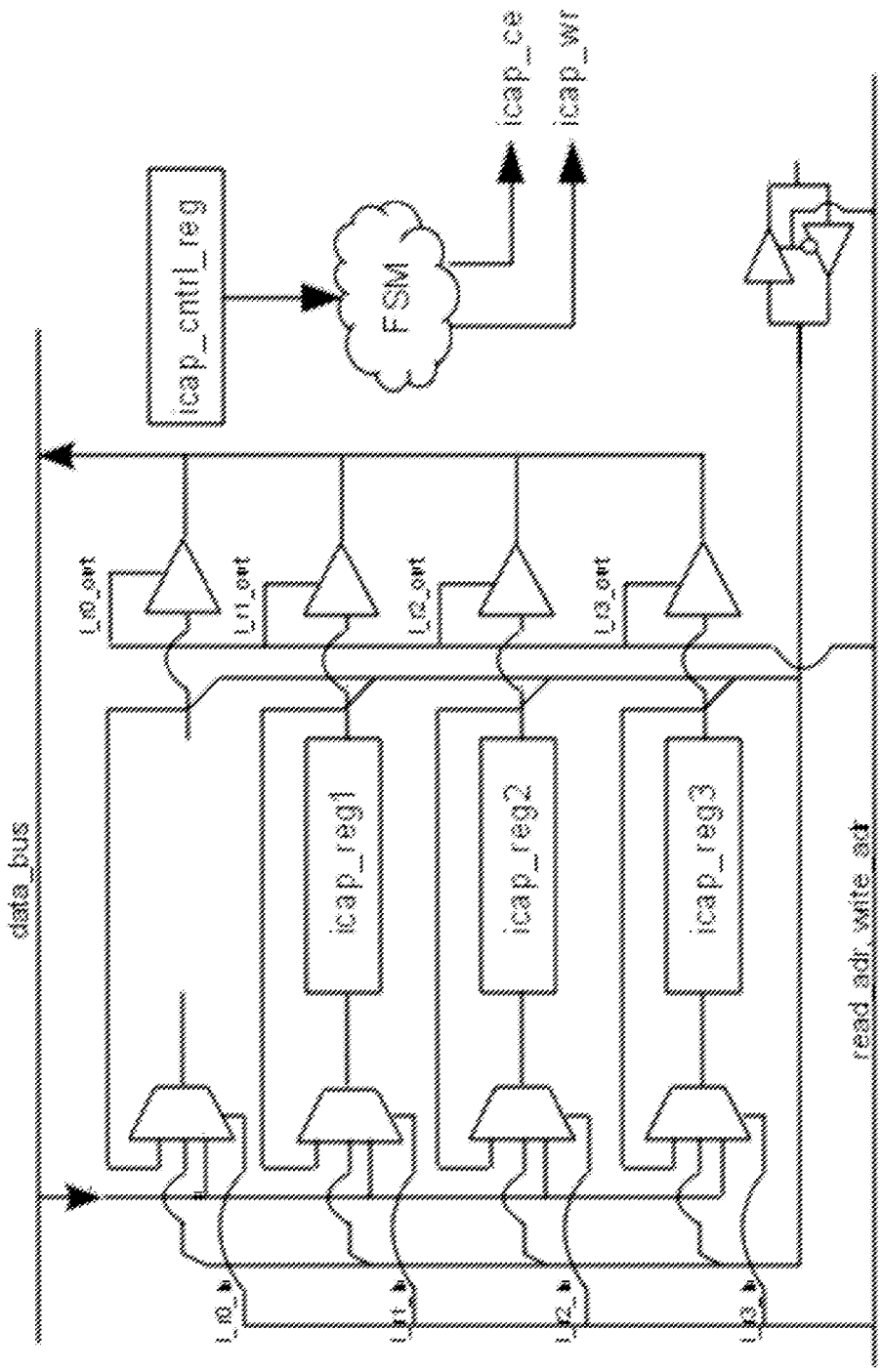
FIG. 3 is a graphic that shows that communication between the configuration memory interface and the controller is done through a data bus, a control bus and a status bus

FIG. 3 shows that the communication between the configuration memory interface and the controller is done through a data bus, two address buses and a status bus, independently of the access port supported.

In one specific example, the main peripherals of the architecture are the CRC calculator (p_crc), the ICAP interface (p_icap) and the PROM interface (p_prom).

In a preferred embodiment, Cycle Redundancy Check (CRC) is chosen for error detection codes. due to the simplicity of the calculation, its performance (even though this standard is meant for serial communications, the CRC code can be calculated in parallel) and its suitability to detect multiple bit errors in a stream of data. CRC is based on polynomial manipulations using modulo arithmetic. Some of the common CRC standards contemplated are CRC-8, CRC-12, CRC-16, CRC-32 and CRC-CCIT.

Figure 4:
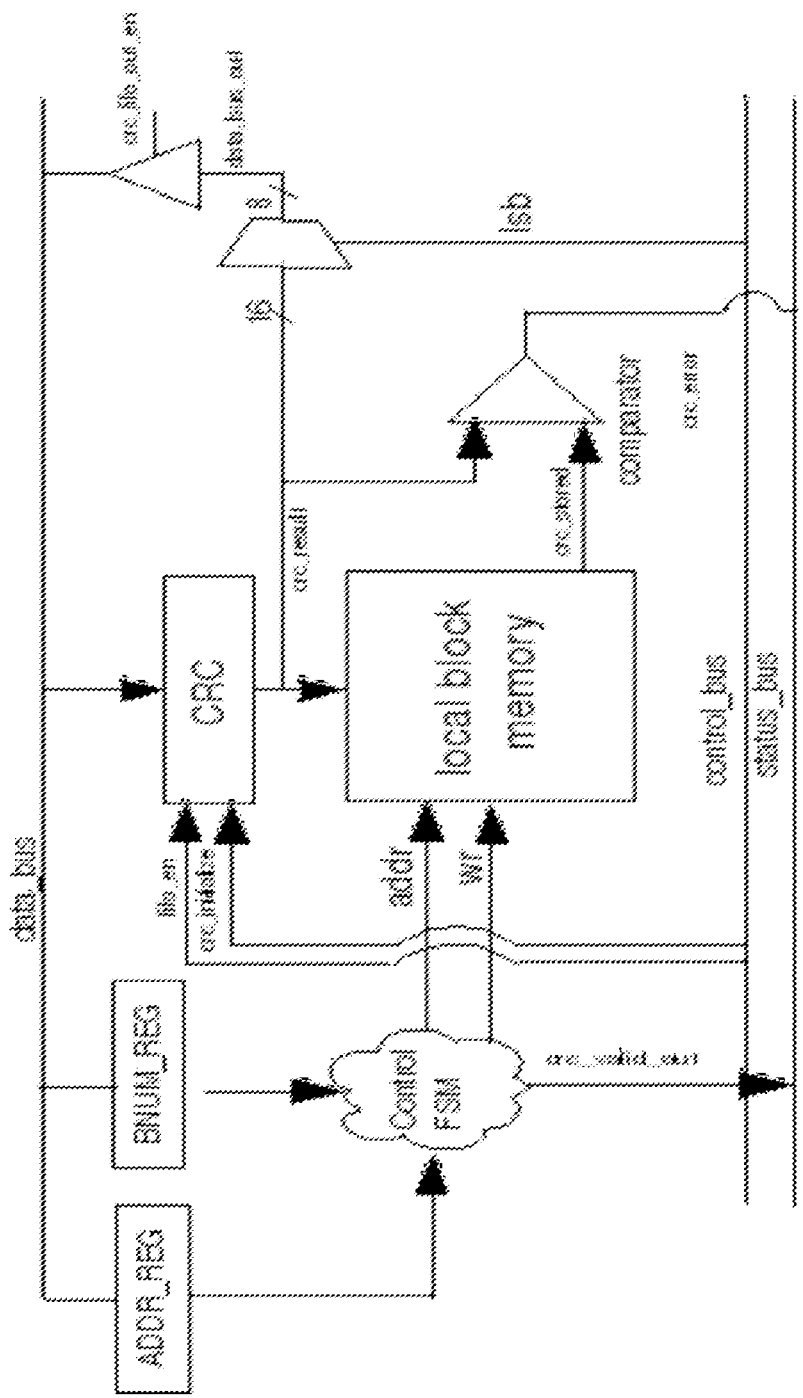
FIG. 4 is a block diagram that shows the block that calculates the CRC

In one example, the CRC calculator p_crc is used to calculate CRC16 error detection codes over a frame or a block of frames. It has local storage capabilities for up to 1024 error detection codes. The same peripheral is able to compare newly calculated CRCs with stored ones and signal the scrubber if a difference is detected. FIG. 4 shows a block diagram of the block that calculates the CRC. Its main feature is the presence of a FIFO used to temporarily store CRC values for later comparison.

Note that Xilinx's devices have a primitive known as FRAME_ECC that can be used to take advantage of the embedded error detection and correction codes in the bitstreams. For this scrubber the decision was made not to use the primitive in order to avoid single point of failures (this primitive cannot be triplicated) and the need for Xilinx's proprietary information. Instead, the CRC approach provides a reliable and simple method to calculate error detection codes reliably. An alternative to this peripheral may include error detection and correction codes virtually embedded in the bitstream. The advantage of this method is that no golden copy of the bitstream is necessary.

Figure 5:
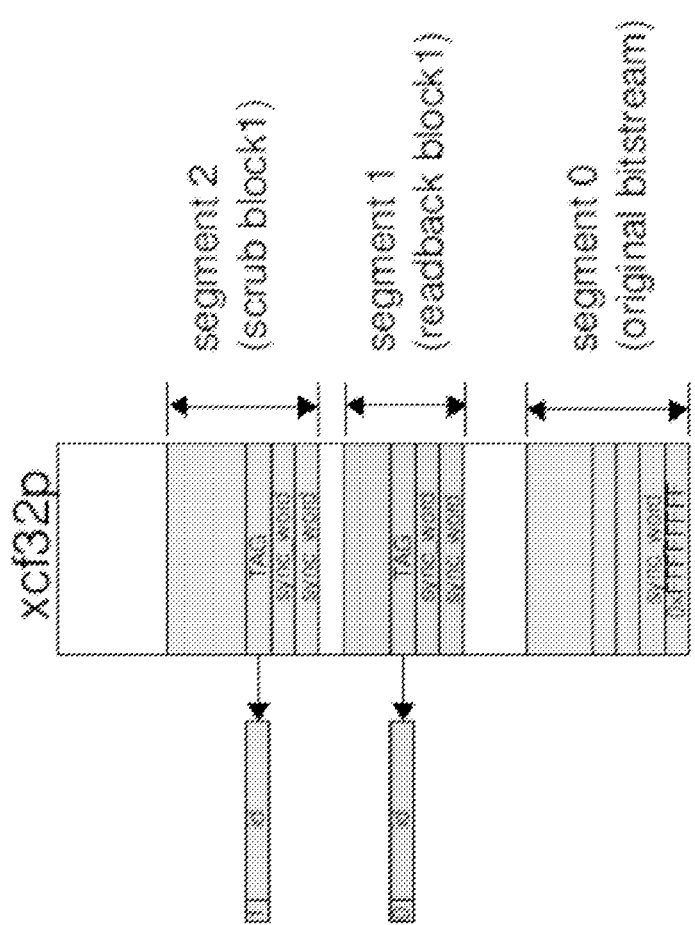
FIG. 5 is a graphic that shows the way the PROM information is partitioned by using ID_TAGs.

The PROM interface (p_prom) peripheral is used to synchronize the data broadcast by the platform's PROM with the needs of the scrubber. PROM is used as a preferred embodiment, but the present invention also contemplates the use of other Non-Volatile Memory, including ROM, CRAM, or EEPROM, for example. In this architecture the platform PROM is used not only to store the original programming bitstream but also snippets of data that the scrubber can recognize and use. FIG. 5 shows the way the PROM information is partitioned by using ID_TAGs to signal the scrubber what information is available at any point in time. Spare space in the PROM can be used to store partial bitstreams for scrubbing as well as long chains of commands that otherwise would have to be stored within the instruction memory. A set of scripts were developed to aide the deployment of the scrubber, including manipulating prom files (.mcs) and insert the necessary user data.

The interface to the ICAP port within the FPGA fabric is p_icap. The functionality of p_icap is rather simple. Four internal registers store a byte each that combined provide a 32-bit wide data bus to ICAP. Another register, addressed within the architecture as the p_icap control register, provides the signaling necessary to drive the ICAP control signals. For instance, several instructions are required for each ICAP transaction (due to the scrubber's 8-bit nature). Although this situation reduces the overall transfer rate to the configuration memory, the scrubber is still able to scrub a mid-size device in 0.2 seconds (8 bits @20 MHz for 32 Mbit PROM).

The scrubber can transfer data at a speed of 2.5×106 32-bit words per second. Considering the current rate of errors for Virtex 4 and Virtex 5 devices (<10 per day 10,11), the scrubber's performance is well within limits.

The self-scrubber embodiment of the invention uses less than 600 slices for the whole system. Note that Xilinx's solution for self-scrubbing uses between 200 and 1200 slices depending on the scrubber configuration.

Algorithms

Figure 6:
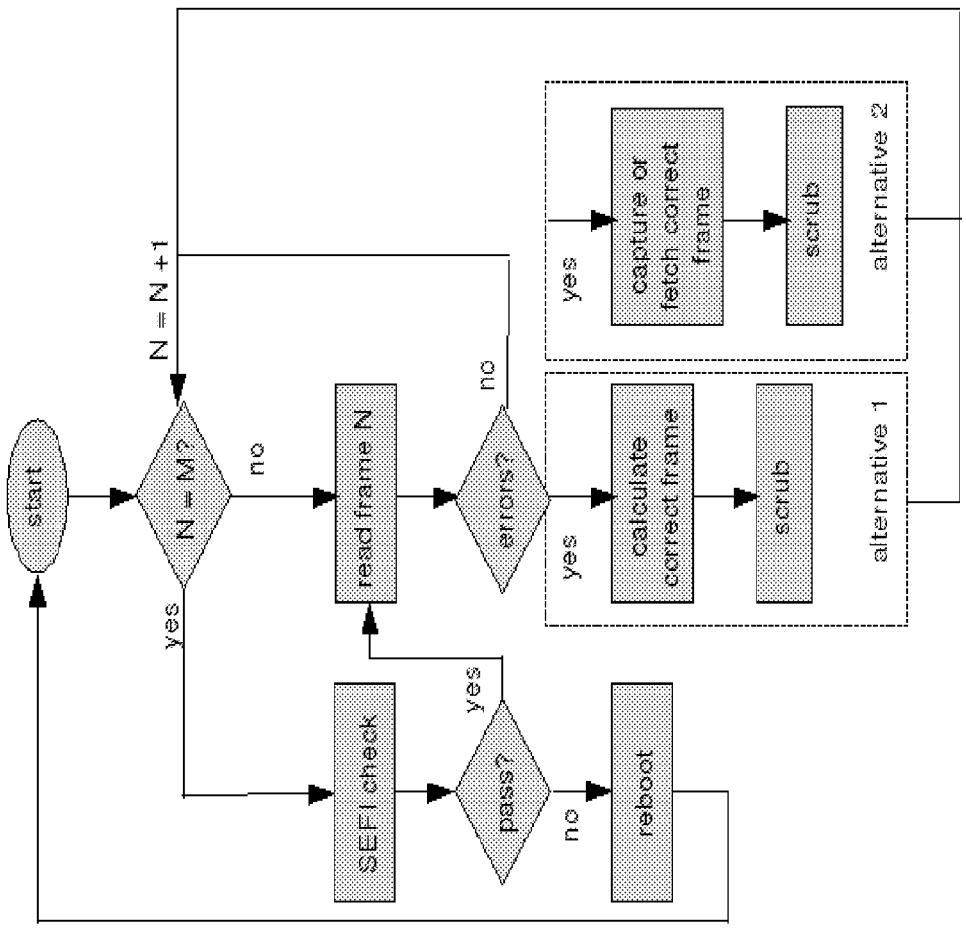
FIG. 6 is a flowchart illustrating error detection and correction.

The correction of an error once detected is an involved operation. The designer has basically two alternatives. As shown in FIG. 6, the first alternative is to use the redundant or parity bits of the error detection and correction code to infer the location of the error within a frame and correct it. The second alternative—in case the redundant bits used only allow error detection but not error correction—is to fetch a golden version of the frame's information from a safe storage and use it to overwrite the corrupted frame.

Read-detect-scrub and SEFI detection/test are two representative tasks that a scrubber has to perform. SEFI tests should be performed always before engaging the configuration memory to make sure that everything is functioning normally and that no upset is present in the configuration memory control logic.

A scrubber performs multiple tasks requiring multiple instructions. An example of the programming and instructions is shown in the available pseudo codes for reading the ID register, for reading a frame, calculating a CRC, performing a CRC checking and active partial reconfiguration (scrubbing).

Pseudocode Example for Reading Device's Id Register
Send command sequence:
sync word AA995566
read id command 28018001
2x no operation 20000000
for "j"=0 to 3
  for "i"=0 to 3
    load byte "i" of word "j" into p_icap reg;
  end for;
end for;
load ENA_READ into p_icap control register;
wait until busy signal is low and jump to
code for reading ID register
READ_STAT:
move status register to reg1;
conditional jump to READ_ID if reg1=BUSY_LOW
always jump to READ_STAT;
Read in device ID
READ_ID:
for "i"=0 to 3
  move p_icap register into reg0;
end for;

Pseudocode Example for Reading a Frame, Calculate its CRC and Compare it with Stored CRC
START: #Send command sequence (see [13])
for T=0 to N
  for "i"=0 to 3
  load byte "i" of word "j" into p_icap reg;
  end for;
end for;
Load 41 into a register to count 41 words of
a frame. Set accumulator register to 0 to
start the count.
load 41 into reg1;
load 0 into accu_reg;
Prepare to readback frame
load ENABLE READ into p_icap control register
wait until busy signal is low
READ_STAT: move status register to reg1;
conditional jump to READ_FR if reg1=BUSY_LOW;
always jump to READ_STAT;
Read in frame and calculate its CRC
READ_FR:
for "i"=0 to 41
  move p_icap register into p_crc data reg;
  jump conditional to CRC_CAL if accu_reg=reg1
end for;
Compare calculated CRC to old CRC. By given
the address of the locally stored CRC CRC_CALC:
move crc_address into p_crc_address register
Read in comparison result
move status to reg1;
jump conditional to SCRUB if reg1=CRC_ERROR;
jump always to START;

Pseudocode Example for Scrubbing a Frame Using a Gold Copy Stored in the Prom
SCRUB:
Load ID tag on p_prom
load ID_TAG_PR1 on p_prom tag_register;
Clock PROM until desired data
load CLOCK_PROM on p_prom control register;
Wait until ID_TAG comes along in prom bus
READ_STAT:
move status register to reg1;
conditional jump to SCRUB_CODE if reg1=ID_TAG;
jump always to READ_STAT;
Scrub a frame (41 words)
SCRUB_CODE:
load 41 into reg1;
load 0 into accu_reg;
for "j"=0 to 41
  for "i"=0 to 3 move p_prom register to p_icap register;
jump conditional to END if accu_reg=reg1;
end for;
end for;
END:

Radiation Hardened by Design—Temporal Latch

Temporal Sampling Techniques

Temporal latches are designs that give any sequential circuit total immunity to both single event upsets and to single event transients. These latches that are both spatially and temporally redundant are immune to (1) static upsets that might occur in the latches themselves, (2) transients that might occur in the combinatorial logic preceding the latches, and (3) transients that might occur in the clocking and control signals of the circuits. This class of latches, which incorporates temporally redundant sampling, is designed to replace conventional latches in any sequential circuit to provide total immunity to both alpha particle and neutron induced data upsets. Accordingly, temporal latches are a preferred method of providing radiation hardening to the scrubber integrated circuit, namely the microcontroller, the additional logic for the CRC computation, and for the memory storage of the CRC and related information.

Generic Temporal Latch

Figure 7:
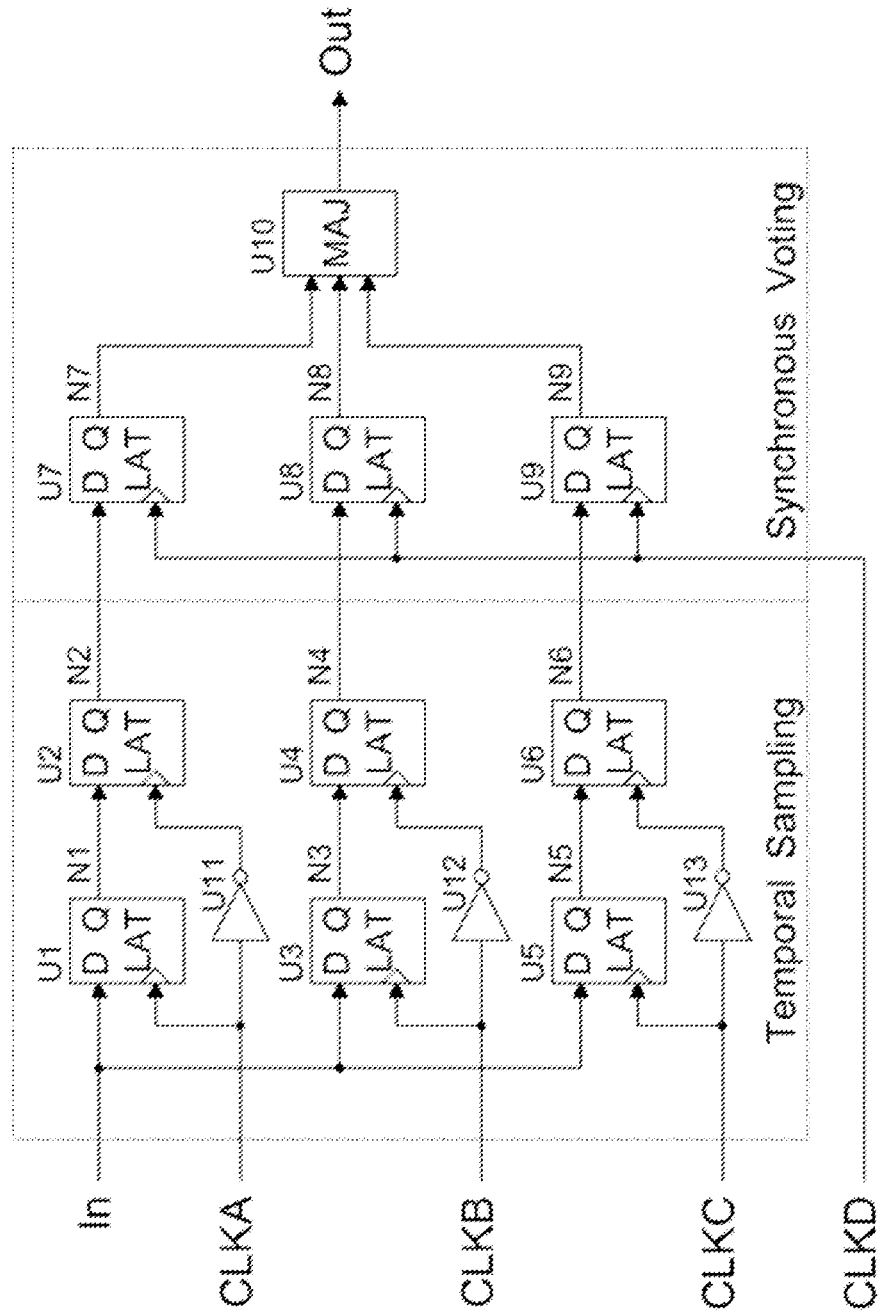
FIG. 7 shows a generic embodiment of the temporal sampling latch.

Referring now to FIG. 7, the most generic embodiment of the temporal sampling latch is shown. This circuit contains nine level sensitive latches (U1 through U9), one majority gate (U10), and three inverters (U11 through U13). Each level sensitive latch is transparent (sample mode) when its clock input is high and is blocking (hold mode) when its clock input is low. When in sample mode, data appearing at the input D also appears at the output Q. When in hold mode, the data stored within the latch appears at the output Q and any data changes at the input D are blocked. Two level sensitive latches in tandem and clocked by complementary clock signals (such as U1 followed by U2) form an edge triggered DFF (D-Flip-Flop). With the clock inversions used in FIG. 7, the DFFs formed by (U1, U2), (U3, U4), and (U5, U6) are triggered on the falling edges of the clocks CLKA, CLKB, and CLKC, respectively.

The three DFFs (U1, U2), (U3, U4), and (U5, U6) operate in parallel and form the temporal sampling stage of the circuit. Each of these three DFFs drives another level sensitive latch. These latches (U7, U8, and U9) together with a simple majority gate (U10) form the synchronous voting stage of the circuit.

The soft error immunity of the circuit in FIG. 7 is a consequence of two distinct parallelisms: (1) a spatial parallelism resulting from multiple parallel sampling circuits, and (2) a temporal parallelism resulting from the multiple sampling of the data over time. Spatial parallelism prevents the usual SEUs in the static latches. Temporal parallelism provides upset immunity to SETs in combinatorial logic, global clock, and global control lines. It should be noted that SEU immunity is achieved solely through circuit function and not by any inherent immunity designed into the latches themselves through process or layout modifications.

Some high reliability systems have, in the past, actually replicated the combinatorial logic and the clock lines to form a totally spatially redundant circuit. Not only does this impose a severe area penalty, but for large redundant blocks of logic with internal latches, error latency becomes an issue because it may be many clock cycles before an error gets flushed and the redundant blocks reestablish synchronization. In the temporal sampling approach, combinatorial logic is effectively replicated, not in space but in time. The same logic is really just used at three different times. As a result, errors are flushed on each clock cycle and the maximum error latency never exceeds a clock period.

Temporal redundancy of the generic circuit is achieved by combining a temporal sampling stage with a synchronous voting stage where the sampling is controlled by three clocks (CLKA, CLKB, and CLKC) and the majority voting is invoked by CLKD. The clocking scheme is therefore central to the operation of circuit and will now be discussed.

Generic Sampling Clocks

Figure 8:
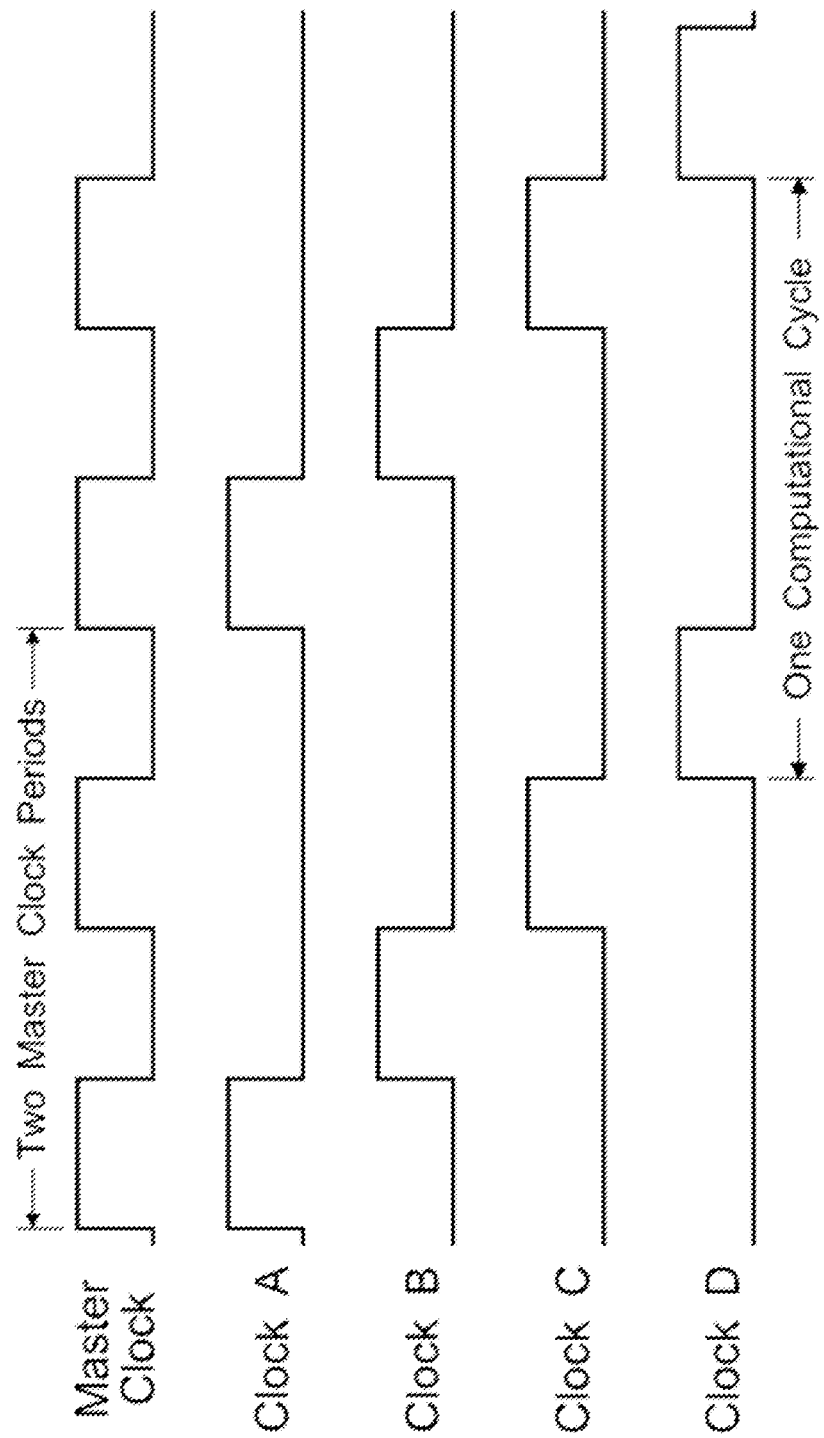
FIG. 8 shows one clocking scheme that might be used for the generic temporal sampling latch.

Referring now to FIG. 8, it shows one clocking scheme that might be used for the generic temporal sampling latch. The operation of the latch and how it achieves its immunity to upset is explained below. Alternative clocking schemes and alternative temporal sampling approaches are also contemplated as within the scope of the present invention.

FIG. 8 shows four cycles of the master clock and two cycles of the temporal sampling latch control clocks. The master clock (top curve) would generally be the clock signal brought onto the chip through an input pad. It could also be a higher frequency clock generated on chip with a clock multiplier synchronized to the input clock through a phase locked loop. The bottom four curves in FIG. 8 show the four clock signals (CLKA, CLKB, CLKC, and CLKD) used in FIG. 7.

Each of these four clocks operates at a 25% duty factor and each is phased to the master clock as shown in FIG. 8. CLKA is high during the first half of cycle one of the master clock. CLKB is high during the second half of cycle one of the master clock. CLKC and CLKD are high during the first and second halves, respectively, of cycle two of the master clock. Thus a full cycle of the A, B, C, and D clocks occupies two cycles of the master clock. Controlling the fidelity of the four clocks is not a problem since the temporal sampling latch will operate correctly even in the presence of skew or overlaps.

Generic Circuit Operation

The operation of the circuit of FIG. 7 with the clocking sequence of FIG. 8 is most easily explained if by starting at the beginning of a computational cycle, which begins at the rising edge of CLKD. At this time the final latches (U7, U8, U9) pass their input data to the majority gate (U10) where it subsequently appears at the output node (OUT). CLKD subsequently goes low, these latches (U7, U8, U9) enter a hold state, and this original data remains asserted on the output for the remainder of the computational cycle.

This output data is then processed by intervening combinatorial logic before it appears at the input to the next temporal latch sampling stage. The data must arrive at the next latch before the falling edge of CLKA, at which time the data is stored in the DFF formed by latches (U1, U2). CLKB then goes high to sample the input. Whatever data is at the input when CLKB goes back low is then stored in the DFF formed by latches (U3, U4). Finally, CLKC toggles high and low to sample and hold the input data in the final DFF formed by latches (U5, U6).

At this time another computational cycle begins. The input data to each temporal sampling latch has been asserted on the three inputs to the majority voting stage. When this next computational cycle begins, CLKD again goes high and the data appears at the output of the majority gate.

Data is released to the combinatorial logic on each rising edge of CLKD and must reach the next sampling latch before the falling edge of CLKA. From FIG. 8, this is just the period of the master clock minus the DFF setup time and minus the sum of the CLKB and CLKC durations. An equivalent way of viewing the incurred speed penalty is that the temporal latch setup time is effectively increased by the sum of the widths of the CLKB and CLKC phases. (It is in fact fundamental that for any latch to be insensitive to a transient of width ⌴T, it must have a setup time in excess of 2⌴T.)

Elimination of Errors

Upsets of the temporal sampling latch are avoided as a result of the spatial parallelism provided by the three circuit branches and the temporal parallelism provided by the sampling and voting architecture of the design. It is simplest to describe the upset immunity of the design in terms of four distinct upset mechanisms: (1) static latch SEU, (2) data SET, (3) sampling clocks SET, and (4) release clock SET. The first of these, static latch SEU, was the upset mechanism of primary concern for earlier technologies of feature sizes larger than 0.35 ⌴m. The last three mechanisms are now of concern in circuits fabricated in 0.25 ⌴m and smaller feature sizes.

Case (1): Static latch SEU occurs when an ionizing event flips the data state of a latch whose clock is low and is in a blocking state (hold mode). Any such single upset in any of the nine latches in FIG. 7 (U1 through U9) will only affect one of the three parallel data paths through the circuit. When data release occurs, one of the three nodes N7, N8, or N9 will be in error while the other two will be correct. The majority gate will then ensure that the correct data value is asserted on the output node. Such a data flip can occur at any time within the computational cycle and not affect the output value.

Case (2): Data input SETs occur when a charged particle strikes a node in the combinatorial logic preceding the temporal sampling latch and the resulting transient propagates to the input node just as a normal signal. This transient will be latched into only one of the three parallel sampling paths if it arrives on a falling edge of one of the three sampling clocks (CLKA, CLKB, or CLKC). Just as for the preceding static latch upset mechanism, only one of the three parallel data paths will be corrupted. When data release occurs, the majority gate will again ensure that the correct data appears at the output node.

Case (3): Charged particle strikes on nodes in the clock generation circuitry or in the clock distribution tree will produce SETs on the clock signal lines that can cause the latches to toggle data at unintended times. The three sampling clocks (CLKA, CLKB, and CLKC) are used symmetrically in the design and can be discussed together. Remember that the controlled latch pairs (U1, U2), (U3, U4), and (U5, U6) each form a falling edge triggered DFF. At falling clock edges, these DFFs store whatever data happens to be present at their inputs. If a clock is low, an SET will result in a rising edge followed by a falling edge. If a clock is high, an SET will produce a falling edge followed by a rising edge. In either case a data store occurs.

There are two time intervals in the computational cycle that may be affected by a sampling clock SET. The first interval starts at the rising edge of CLKD (beginning of a computational cycle) and ends when the released data arrives at the input to the temporal sampling latch, which will experience a sampling clock SET. The second interval starts at this data arrival time and ends when CLKD again transitions high (beginning of the next computational cycle).

If the SET induced falling edge on any of the sampling clocks occurs in the first of these intervals, old data will be stored in one of the three parallel sampling paths. The true (intended) falling edge will occur later and the correct data will be sampled. The only exception is for CLKA, which may experience an SET that overlaps the true falling edge. This shifts the falling edge to an earlier time by an amount less than or equal to the SET pulse width. If this shift causes a setup time violation of the (U1, U2) DFF, then old (incorrect) data may be stored in the first of the three parallel sampling paths. As in the above cases, only one of the three parallel paths will be corrupted and the majority gate once again produces correct data values at the output.

If the SET induced falling edge occurs in the second of the intervals defined above, the only effect will be to store the correct data. This SET may occur before the actual clock edge (in which case the correct sampling is performed early) or it may occur after the actual clock edge (in which case correct data is re-sampled). The SET may overlap the true clock edge in which case a single correct sampling is performed slightly early.

Case (4): The effects of an SET on the release clock (CLKD) are somewhat different than those on the sampling clocks discussed above. Again, it is easiest to discuss two distinct time intervals in the computational cycle. The first interval is when CLKD is high and the second interval is when CLKD is low.

A negative transient when CLKD is high causes each of the final latches (U7, U8, and U9) to momentarily hold what was being sampled and then, when the clock restores, continue to sample what was being sampled in the first place. This event therefore has no effect on the operation of the circuit.

A positive transient when CLKD is low will cause each of the final latches (U7, U8, and U9) to first sample its input (become transparent) and pass the value to the majority gate and then store (hold) this data value for the majority gate when the transient disappears. The effect depends the current state of CLKA, CLKB, and CLKC.

If such a positive transient occurs before the falling edge of CLKA in the computational cycle, nodes N2, N4, and N6 in FIG. 7 will still have their original values and the majority gate output will not change. If the event occurs between the falling edge of CLKA and the falling edge of CLKB, node N2 may have changed but nodes N4 and N6 will still have their original values and the majority gate will still produce the correct output. Finally, if the transient occurs between the falling edge of CLKB and the falling edge of CLKC, both nodes N2 and N4 may have changed (to the next cycle values) and only node N6 will have its original value. In this case the majority gate output may change. However, this is simply a premature change to the next output data value that would have eventually occurred anyway when CLKD was scheduled to rise. This premature data change could then get latched into the CLKC branch of a downstream sampling latch if it arrives before the falling edge of CLKC.

If this transient on CLKD is local to a single sampling latch, then the majority gate of the downstream temporal sampling latch will suppress the erroneous value (just as it suppresses the Case (1) and Case (2) events discussed above) and the premature data release will be confined to the single affected latch. If this transient is common to a group of sampling latches, all latches in the group will release prematurely. If the transient is global to the chip, such as would happen if the transient occurred in the clock generator, then all latches on the chip will prematurely release their data. In each case, nodes are simply assuming correct data values one quarter of a computational cycle early. All data values achieve correct synchronization at the start of the next computational cycle.

An important point that applies to each of the four upset mechanisms just described is that any erroneous data stored in any of the sampling latches gets flushed within a single computational cycle. Any premature data releases get back in phase within one quarter of a computational cycle. Thus the latency of these erroneous values never exceeds one computational cycle. Also, the above discussions assume that the width of the SET is less than the width of any of the four clock pulses that control the latch. If the SET pulse width exceeds any of the clock pulse widths, then the temporal sampling latch will exhibit a non-zero error rate. In particular, the widths of the CLKB and CLKC phases must each be greater than the transient width. This is the reason for the earlier statement that any temporal sampling latch must incur a setup time penalty of at least twice the transient width if the transient is to be effectively removed.

This fundamental setup time limitation has interesting consequences for a number of circuit topologies. Certain gate sequences, such as NAND-NOR chains, can introduce transient pulse broadening. Positive transients are broadened if the NAND rise time is faster than its fall time and the NOR rise time is slower than its fall time. It is the final transient pulse width, present at the input to the temporal sampling latch, that determines the CLKB and CLKC widths needed for complete error elimination. Circuit designers must be aware of these effects and their ramifications on the effectiveness of temporal sampling. Dynamic CMOS design styles, in particular, should be avoided if temporal sampling is to be practical. Dynamic nodes do not return to their correct state and the resulting transient widths are infinite. At a minimum, feedback devices (keepers) should be employed on critical nodes so that the incorrect state does not persist indefinitely.

Practical Circuit Implementations

Example

Minimal Level Sensitive Latch

Figure 9:
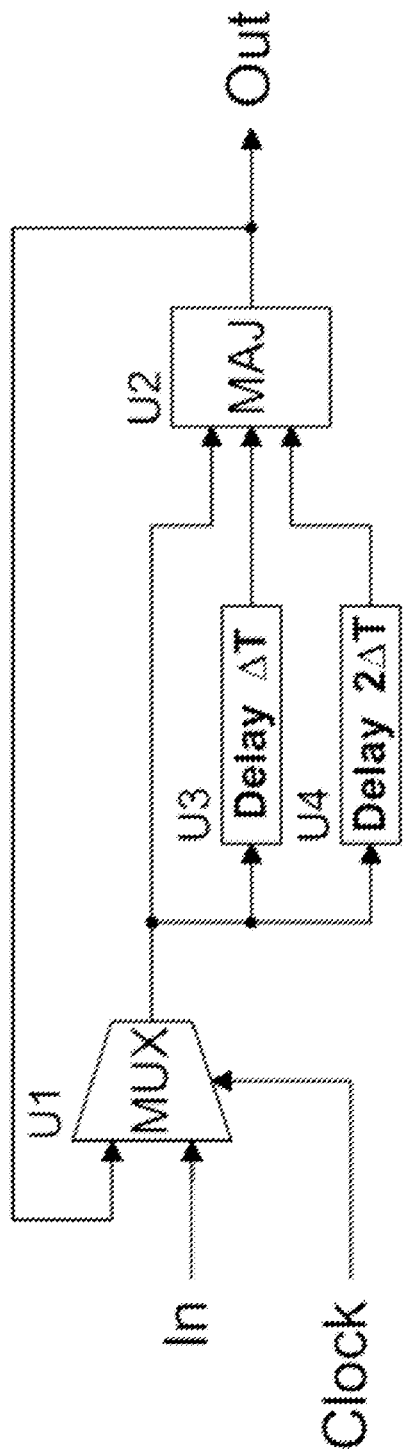
FIG. 9 is a circuit diagram that shows an example of an application of temporal sampling.

Referring now to FIG. 9, an example of an application of temporal sampling is provided. One way to describe a level sensitive transparent latch is as a two-input MUX (multiplexer) with its output fed back to one of its inputs, the data fed to its other input, and the select line controlled by the clock signal. Since this is really just a standard combinatorial logic gate, it should be possible to use temporal sampling to replicate the function of the MUX in time and achieve the same SEU immunity as if it were replicated spatially. In this way, temporal sampling achieves the equivalent of triple spatial redundancy by simply reusing the same MUX at three different times.

FIG. 9 shows how this is accomplished. Rather than feed the MUX output directly back to one of its inputs, we first sample the MUX (U1) output using a voting circuit (U2) along with sampling delays (U3 and U4) and then feed the majority of the sampled data back to the input. Even though the MUX is itself part of the temporal latch, we sample it as though it were part of the preceding combinatorial logic circuitry. By using the MUX (and also the majority gate) at three separate times, we are effectively replicating the temporal latch, not in space, but in time. In this way we achieve the equivalent of triple spatial redundancy without actually physically replicating the circuitry.

Perhaps one of the most important features of this temporal latch is that it is also immune to transients occurring on the input clock node. Any clock transient momentarily switches the selected MUX input producing a possible transient at the MUX output. Since this is just the data input to the temporal sampling circuitry, it is eventually rejected by the voting circuitry. Thus, this version does not require SET hardened clock nodes.

Another feature of the temporal latch in FIG. 9 is that with appropriate increase of the ⌴ T value in the sampling delays, the latch can be made immune to upset from double node strikes. This feature makes this version particularly attractive for spaceborne applications where high-energy cosmic rays can easily travel through the silicon just under the surface and strike multiple sensitive junctions. Very little must be done with regard to layout to ensure that this latch is immune to upset from multiple node strikes. One only has to ensure that all sensitive nodes in the first delay are not lined up with all sensitive nodes in the second delay.

Further, concerning global control signals, set and reset lines present no problems for the temporal latches discussed herein so far as long as all set and reset operations are synchronous. For synchronous signals, all single event transients are automatically removed by the temporal latch in exactly the same way that data transients are removed. Asynchronous sets and resets were previously avoided for deep submicron spaceborne applications since the microcircuit is susceptible to SET induced errors at all times while synchronous operations are only susceptible at clock edges. However, the temporal sampling latch of FIG. 9 is also immune to asynchronous control line transients and can safely be used in any ionizing radiation environment.

Finally, the temporal sampling latch in FIG. 9 is level sensitive which means that an edge triggered master-slave DFF must be constructed from two instances, one controlled by the clock and the other by the inverse of the clock. The transparent level sensitive latch version is, however, important in its own right since it allows the slack borrowing and time stealing techniques often used in custom high-performance microprocessor designs. Level triggered latches propagate input data to their outputs whenever the clocking signal is active, thus making the latch data triggered. Such applications resemble pipelines, with combinatorial logic located between transparent latches and with the clock alternately controlling the transparent latches.

Fast Local Scrubbing and BCH Codes

The present invention also includes the ability to correct the errors in a frame without accessing a storage for golden frames and thus achieve very fast focused scrubbing with the benefit of speed and lower power. However, since multi-bit error correcting codes fail when the number of errors exceed the code's capability, a backup mechanism is provided. The CRC alternative discussed earlier is a good alternative in these cases. The innovation here is to combine the check bits from error correcting codes and the CRC to form a fool proof fast local scrubbing mechanism. This system does add complexity and latency to the scrubber but the benefits in terms of fast per frame scrubbing, with no need to access the PROM or other storage, and the resultant lower power operation may far out weigh these drawbacks.

In a preferred embodiment of the invention, binary BCH error correcting codes are used. However, the scope of the present invention is not so limited and it is contemplated to also include the use of non-binary symbol based codes such as Reed-Solomon codes.

The BCH codes allow flexibility in designing the code to correct for a specified number of errors 't'. BCH codes are specified by the code size 'n', the number of bits that can be corrected T and the number of information bits 'k' as (n,k,t). The number of information bits 'k' is derived from the specification of 'n' and T. The code size 'n' is equal to $2^m-1$ so that we actually specify 'm'. The fact that $n=2^m-1$ means that if the frame size is k' then k=n−t>k'. What this means is that for each frame 'j' of length k' when k'<k, we have to add pad bits (these could be zeroes or a random sequence of '1's and '0's) to the frame prior to encoding with the BCH coder to produce 'n' bits or in other words, (n−k) check bits. We will address this issue in later paragraphs.

Figure 10:
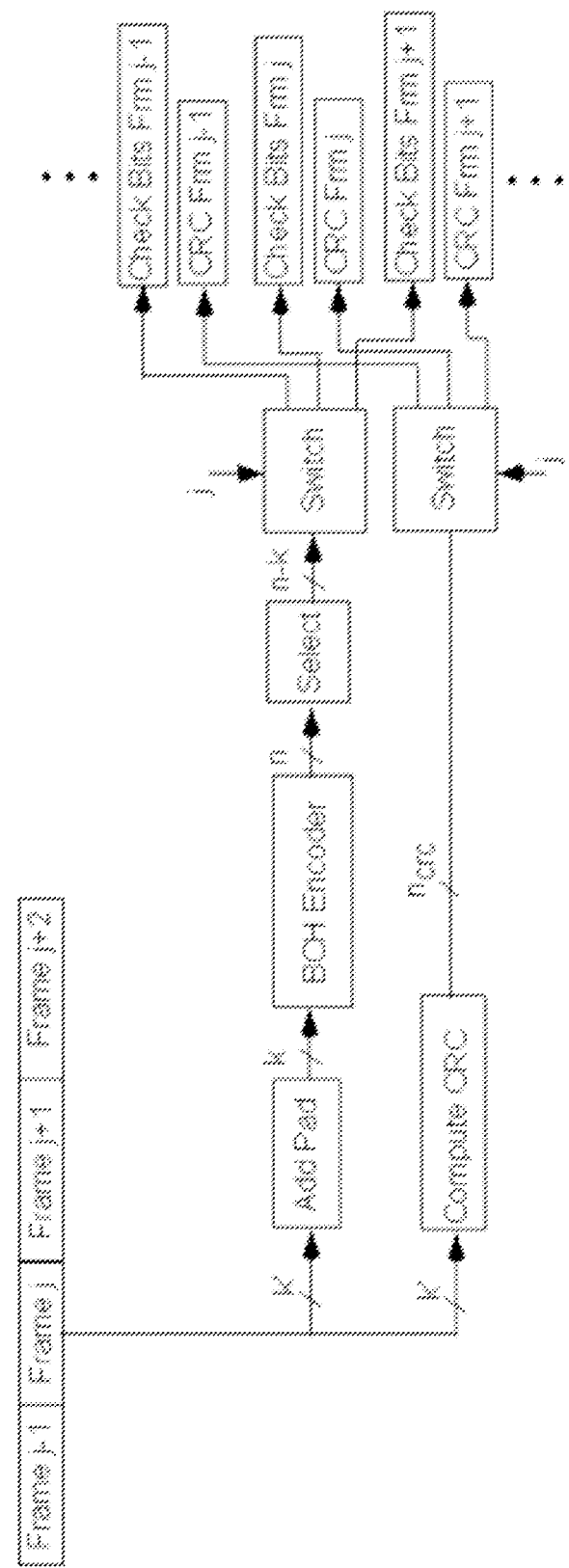
FIG. 10 is a graphic that shows an initial setup where for each golden frame both the BCH check bits and CRC are calculated and stored.

Referring now to FIG. 10, which shows the initial setup where for each golden frame both the BCH check bits and CRC are calculated and stored. Note that the size of the check bits and CRC are small compared to the frame size. In the figure, we add the pad bits to the k' bit frame forming 'k' information bits. These are encoded into an 'n' bit BCH code. We select the (n–k) check bits and store them in the Check Bit register for frame 'j'. We also calculate the CRC for the k' bit frame and store it in the CRC register for frame 'j'. So for each protected frame we have a check bits register and CRC calculated based on the uncorrupted frame.

Figure 11:
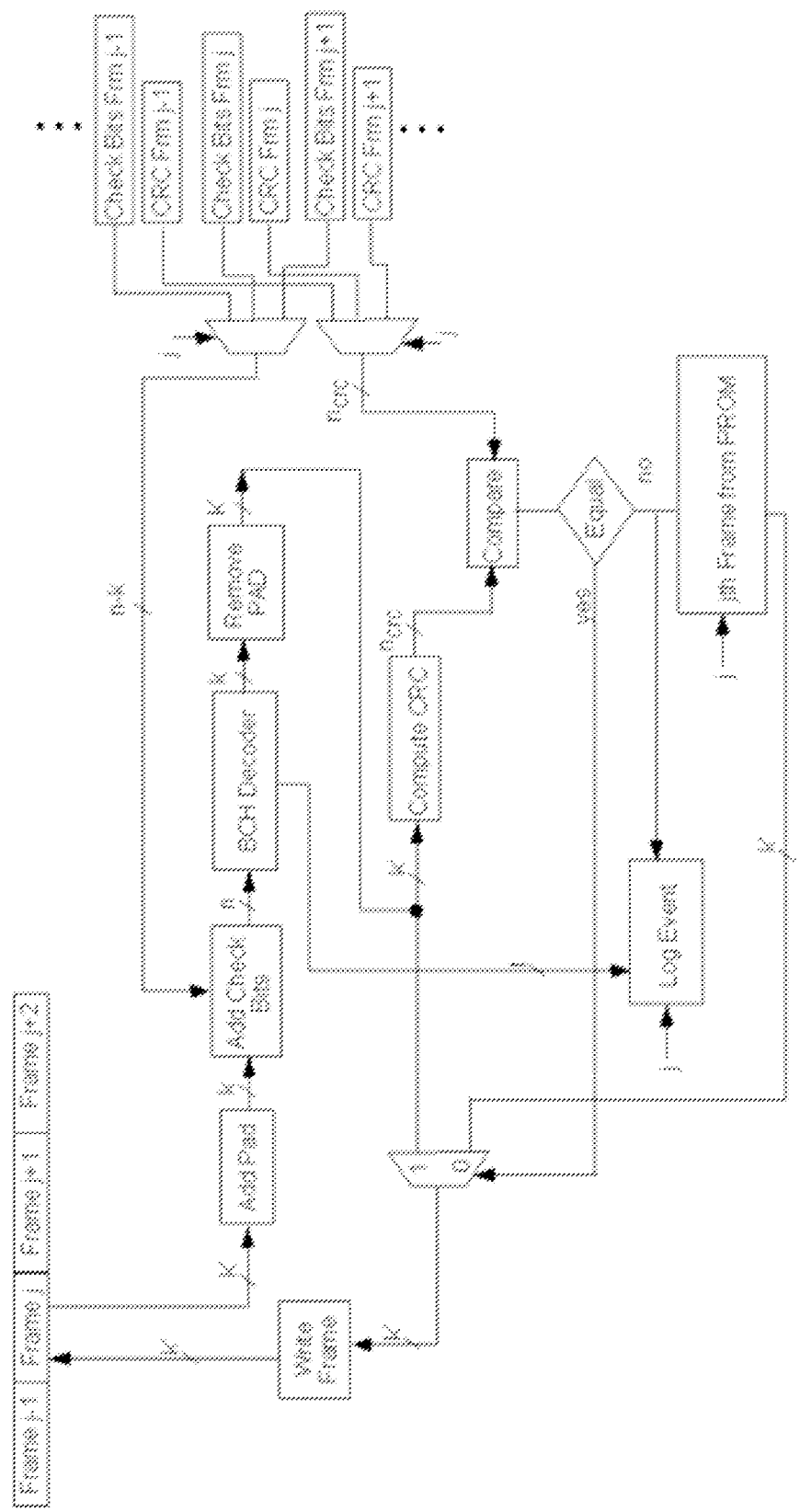
FIG. 11 is a graphic showing scrubber reads the frames and corrects any errors and calculates the CRC of the corrected frame in conjunction with the use of a BCH encoder/decoder.

Referring now to FIG. 11, during operation where the frames are subjected to radiation, the scrubber reads the frames and corrects any errors and calculates the CRC of the corrected frame. If the CRC matches the reference CRC then the frame is replaced with the corrected frame. If the CRC does not match this means more than T bits were in error. In this case, the frame has to be updated from the PROM which entails a penalty in both power consumption and latency. By trading off complexity in the scrubber by using more error correcting capability (increasing T) the probability of a mismatch between the corrected frame CRC and reference CRC is minimized.

One feature of this approach is that the event where the CRC's do not match can be logged with the frame number. This data is invaluable for analyzing the impact of the radiation on the system.

An important feature is that in the unique application of BCH error correction to the scrubber, the system has differences with a communication link. In a communication link any of the 'n' bits of the code word can be hit by a bit error. In our proposal, only the k' bits are subject to a bit error. The check bits and the pad bits are not affected since the check bits could be stored in the Rad Hard scrubber chip. The pad bits are deterministic and are generated in the scrubber chip.

In one example, there is provided wherein the synthesized BCH (1023, 983,4) encoder and decoder using the ViASIC IBM RHBD 90 nm 9LP process has a gate count of 282 gates for the encoder and 9572 gates for the decoder. The number of check bits is 40 bits in this case.

The references recited herein are incorporated herein in their entirety, particularly as they relate to teaching the level of ordinary skill in this art and for any disclosure necessary for the commoner understanding of the subject matter of the claimed invention. It will be clear to a person of ordinary skill in the art that the above embodiments may be altered or that insubstantial changes may be made without departing from the scope of the invention. Accordingly, the scope of the invention is determined by the scope of the following claims and their equitable Equivalents.

We claim:

1. A scrubber for detecting and correcting errors in a configurable logic device, comprising an application specific integrated circuit having:
   (i) an embedded radiation-hardened-by-design micro-controller,
   (ii) radiation-hardened-by-design message digest (CRC) computation logic,
   (iii) radiation-hardened-by-design register storage,
   (iv) a configuration interface that communicates with the micro-controller through a data bus, two address buses, and a status bus, and
   (v) an error detection and correction encoding/decoding circuit;
   wherein the radiation-hardened-by-design integrated circuit comprises one or more temporal latches used for register storage.

2. The scrubber of claim 1, wherein the radiation-hardened-by-design comprises Dual Interlocked Cell (DICE) registers for storage.

3. A system, comprising (i) a configurable logic device, (ii) the scrubber of claim 1 connected to the configurable logic device, and (iii) a non-volatile memory read only memory (ROM) connected to the scrubber of claim 1.

4. The system of claim 3, wherein the configurable logic device is an FPGA.

5. The system of claim 3, wherein the scrubber is external to the FPGA.

6. The system of claim 3, wherein the scrubber is integrated within the FPGA.

7. The system of claim 3, wherein the Non-Volatile Memory has program instructions directing the microcontroller of the scrubber to implement a process that calculates and stores message digest data for each frame on the FPGA and adds a header to the message digest data of each frame to create a verified message digest data, wherein the header includes a verification key.

8. The system of claim 7, wherein the message digest data is a CRC or checksum.

9. The system of claim 7, wherein the verified message digest data is stored in one or more temporal latches.

10. A method of computing a message digest on a frame by frame basis in a system of claim 9 and storing the message digests in temporal latches/registers with tags to identify frame message digest and check bits.

11. In a system of claim 9, a method comprising the steps of reading back frames from an FPGA, adding pad bits and check bits to form n bit code, decoding the n bit code using a BCH decoder, and correcting the bit errors.

12. In the method of claim 11, further comprising the step of writing back into the FPGA the error corrected frame.

13. A method detecting a configuration error in a configurable logic device comprising the steps of (1) comparing on a frame-by-frame basis the message digest data of each frame written to the configurable logic device against a stored pre-computed message digest data for each frame wherein the pre-computed message digest data is stored in a one or more temporal latches of a scrubber integrated circuit, and (2) reporting a configuration error within a frame where the message digest data of a frame written to the configurable logic device is not identical to the stored pre-computed message digest data in the temporal latch of the scrubber integrated circuit.

14. The method of claim 13, wherein the configurable logic device is an FPGA.

15. The method of claim 13, wherein the message digest data is a CRC or checksum.

16. The method of claim 13, further comprising the step of correcting the error using BCH error correcting codes.

17. The method of claim 13, wherein the scrubber integrated circuit comprises a microcontroller, a non-volatile read only memory, and a configuration memory interface, and further comprising the preliminary step of loading instructions into the microcontroller from the non-volatile memory to implement the process steps of (1) comparing and (2) reporting.

18. The method of claim 17, further comprising a pre-processing step of adding frame ID tags to the bitstream to create a modified bitstream, wherein the microprocessor parses the modified bitstream to identify frames to compute CRC and check bits.

19. The method of claim 17, further comprising wherein error correcting codes are used to correct bit errors.

20. The method of claim 19, wherein the error correcting codes are BCH codes.

21. The method of claim 20, wherein the pre-processing step adds pad bits to the frame to form k bit message for BCh encoding.

22. The method of claim 21, wherein the check bits are computed on the fly as the configuration is loaded on a frame by frame basis into FPGA and wherein the check bits are stored in temporal latches registers.

23. The method of claim 21, further comprising the steps of computing the message digest of the error corrected frame, comparing the message digest with the stored message digest for the frame that is stored in the scrubber, and if there is a match, doing nothing, and if there is a mismatch reloading the frame from the non-volatile memory and writing to the FPGA.

24. The method of claim 23, further comprising the step of logging multiple bit errors for later retrieval and analysis.

\* \* \* \* \*